(12) United States Patent
Kim

(10) Patent No.: US 7,447,111 B2
(45) Date of Patent: Nov. 4, 2008

(54) COUNTER CONTROL SIGNAL GENERATING CIRCUIT

(75) Inventor: Keun Kook Kim, Cheongiu-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/728,095

(22) Filed: Mar. 23, 2007

(65) Prior Publication Data

US 2008/0100358 A1  May 1, 2008

(30) Foreign Application Priority Data

Oct. 27, 2006   (KR) ...................... 10-2006-0105249

(51) Int. Cl.
*G11C 8/00* (2006.01)
(52) U.S. Cl. .................. 365/236; 365/233; 365/191
(58) Field of Classification Search .................. 365/236, 365/233, 191, 233.5, 193, 241, 185.22
See application file for complete search history.

(56) References Cited

U.S. PATENT DOCUMENTS

| | | | |
|---|---|---|---|
| 6,229,759 B1 * | 5/2001 | Morgan | .................. 365/233.18 |
| 6,564,287 B1 | 5/2003 | Lee | |
| 7,164,287 B2 | 1/2007 | Ueno | |
| 7,171,323 B2 | 1/2007 | Shipton et al. | |
| 2006/0203605 A1 * | 9/2006 | Lee | .......................... 365/233 |

FOREIGN PATENT DOCUMENTS

KR   10-2007-0095563 A   10/2007

* cited by examiner

*Primary Examiner*—Dang T Nguyen
(74) *Attorney, Agent, or Firm*—John P. White; Cooper & Dunham LLP

(57) ABSTRACT

A counter control signal generating circuit is disclosed. The circuit includes a first counter configured to receive a latched external address, and count the latched external address for a first latency, thereby generating a first counted address, a second counter for counting the first counted address for a second latency, thereby generating a second counted address, a counter control signal generator configured to receive a write recognition signal, which is enabled in response to a write command, and generate a counter control signal for controlling enabling of the second counter, in response to the write recognition signal, a first detecting signal generator configured to receive the write recognition signal, generate a first command signal obtained after counting of the write recognition signal for the first latency, and generate a first detecting signal, which is enabled in response to the write recognition signal, and a second detecting signal generator configured to receive the first command signal, generate a second command signal obtained after counting of the first command signal for the second latency, and generate a second detecting signal, which is enabled in response to the first command signal.

20 Claims, 9 Drawing Sheets

COUNTER CONTROL SIGNAL GENERATING CIRCUIT

BACKGROUND

The present disclosure relates to a counter control signal generating circuit, and more particularly to a counter control signal generating circuit capable of preventing current consumption caused by a column address strobe (CAS) latency counter unnecessarily operating during a read operation.

In memory devices of a double data rate 2 (DDR2) SDRAM grade or higher, a new concept of additive latency (AL) and write latency (WL) has been introduced. In accordance with this concept, WL is defined to be equal to "AL+CAS latency (CL)−1", and read latency (RL) is defined to be equal to "AL+CL".

On the other hand, when viewing at the side receiving an external address, RL is defined to be equal to AL because CL in a read operation is undertaken at the side of a data output stage.

The introduction of AL and WL is advantageous in that the input positions of read or write commands can be more freely determined. However, a drawback also occurs due to the newly introduced AL and WL. The drawback is an increase in current consumption caused by a CL counter operating to control the AL and WL.

In order to reduce the current consumption, a current consumption reduction scheme has been proposed in which the operation of the counter is stopped when read or write operation cannot be carried out, that is, when all banks are in a precharged state, namely, in an idle state. However, this scheme still has a problem of a current consumption caused by an unnecessary operation of the CL counter carried out during a read operation.

Accordingly, in order to prevent the current consumption caused by the unnecessary operation of the CL counter during the read operation, a read-write address generating circuit has been developed which is capable of stopping an operation of the CL counter when a read command is input.

FIG. 1A is a block diagram illustrating a configuration of a conventional read-write address generating circuit.

The conventional read-write address generating circuit includes an address latch unit (Address Latch Block) A1 for receiving an external address signal Address, and outputting a latched address signal Latched RDWT Address in synchronism with a read or write command RDWT, an AL counter (AL Count Block) A2 for receiving the latched address signal Latched RDWT Address, and outputting an AL counted address signal AL Counted Address counted in accordance with a predetermined AL, in synchronism with a count clock signal Count Clock and an AL signal AL, and a read address generator (Read Control Block) A3 for receiving the AL counted address signal AL Counted Address, and generating a read address signal Read Address for an actual read operation. The circuit also includes a counter control signal generator (CL_Count_Clock Control) A4 for receiving a read recognition signal IRD, which is enabled in accordance with a read command, an internal clock signal ICLK, which is an internal count clock having the same period as an external clock, and generating a counter control signal CL_Count_Clock for controlling operation of a CL counter (CL Count Block) A5. The CL counter A5, which is also included in the circuit, receives the AL counted address signal AL Counted Address, and outputs a CL counted address signal CL Counted Address counted in accordance with a predetermined CL, in synchronism with a CL signal CL, and a write address generator (Write Control Block) A6 for receiving the CL counted address signal CL Counted Address, and generating a write addressing signal Write Address for an actual write operation.

Hereinafter, operation of the counter control signal generator (CL_Count_Clock Control) A4 will be described in detail with reference to FIG. 1B. First, when the write recognition signal WT is enabled, namely, is transited to a high level, in accordance with a write command, an enable signal CLKCTL is transited to a high level, thereby causing a NAND gate NDA3 to operate as an inverter. As a result, the counter control signal CL_Count_Clock is assumed an inverted signal of the internal clock signal ICLK, so that it is enabled. Accordingly, the CL counter (CL Count Block) A5 operates. On the other hand, when the read recognition signal IRD is enabled, namely, is transited to a high level, in accordance with a read command, an enable signal CLKCTL is transited to a low level. As a result, the counter control signal CL_Count_Clock is transited to a high level, namely, a disable state. Accordingly, the operation of the CL counter (CL Count Block) A5 is stopped. Thus, the counter control signal generator (CL_Count_Clock Control) A4 prevents current consumption caused by an unnecessary operation of the CL counter (CL Count Block) A5 carried out during a read operation by generating a counter control signal CL_Count_Clock enabled in response to a write command, and disabled in response to a read command.

In the above-mentioned read-write address generating circuit, however, an internal problem may occur in accordance with AL. This will be described with reference to FIG. 1C depicting a timing diagram of internal signals of the counter control signal generator.

When it is assumed that burst length (BL) is 4, as shown in FIG. 1C, a write command may be generated after a period of 4 clocks has elapsed from generation of a read command RD(2). On the other hand, a read recognition signal IRD, which disables the counter control signal CL_Count_Clock, is generated after a delay period corresponding to an AL has elapsed from the generation of the read command. In this case, if the AL is 4, the enable period of the read recognition signal IRD generated in accordance with the read command RD(2) may overlap with the enable period of a write recognition signal WT generated in accordance with a write command WT (3), as indicated by a circle a in FIG. 1C. As a result, as indicated by a block b in FIG. 1C, the enable period of the counter control signal CL_Count_Clock may be terminated after one clock. In this case, there is a problem in that it may be impossible to completely receive a write address.

BRIEF SUMMARY

In one aspect of the present disclosure, a counter control signal generating circuit comprises a first counter configured to receive a latched external address, and count the latched external address for a first latency, thereby generating a first counted address, a second counter for counting the first counted address for a second latency, thereby generating a second counted address, a counter control signal generator configured to receive a write recognition signal, which is enabled in response to a write command, and generate a counter control signal for controlling enabling of the second counter, in response to the write recognition signal, a first detecting signal generator configured to receive the write recognition signal, generate a first command signal obtained after counting of the write recognition signal for the first latency, and generate a first detecting signal, which is enabled in response to the write recognition signal, and a second detecting signal generator configured to receive the first command signal, generate a second command signal obtained after counting of the first command signal for the second latency, and generate a second detecting signal, which is enabled in response to the first command signal.

The counter control signal may be enabled in response to the first detecting signal and the second detecting signal.

At least one of the first and second detecting signals may be maintained in an enable state until the second command signal is generated.

The counter control signal generator may comprise a first logic device configured to receive the write recognition signal and a first reset signal, and perform a logical operation to the write recognition signal and the first reset signal, a second logic device configured to receive the first and second detecting signals, and perform a logical operation to the first and second detecting signals, a first logic unit configured to receive an output signal from the second logic device and a second reset signal delayed from the first reset signal for a predetermined period, and perform a logical operation to the output signal of the second logic device and the second reset signal, a latch unit configured to receive and latch an output signal from the first logic device and an output signal from the first logic unit, and a second logic unit configured to receive a signal delayed from an output signal from the latch unit for a predetermined period and an internal clock, and perform a logical operation to the delayed signal and the internal clock, thereby generating the counter control signal.

The first detecting signal generator may comprise a latch unit comprising first to fourth latches, which are connected in series, to sequentially latch the write recognition signal in response to an internal clock, a command signal generator comprising a first transfer device for transferring the write recognition signal, as the first command signal, in response to a first latency signal, a second transfer device for transferring an output signal from the second latch, as the first command signal, in response to a second latency signal, and a third transfer device for transferring an output signal from the fourth latch, as the first command signal, in response to a third latency signal, a signal transfer unit comprising a first transfer unit for transferring an output signal from the first latch, in response to a first latency enable signal, and a second transfer unit for transferring an output signal from the third latch in response to a second latency enable signal, and a detecting signal generator configured to receive a signal obtained for buffering the write recognition signal and the signals transferred from the first and second transfer units, and perform a logical operation to the received signals, thereby generating the first detecting signal. The first latency enable signal may be enabled in response to the second or third latency signal. The second latency enable signal may be enabled in response to the third latency signal.

The first transfer unit may comprise a first logic device configured to receive the output signal from the first latch, a signal obtained after buffering the output signal from the second latch, and the first latency enable signal, and perform a logical operation to the received signals, and a second logic device configured to receive the output signal from the first logic device and the first latency enable signal, and perform a logical operation to the output signal of the first logic device and the first latency enable signal.

The second transfer unit may comprise a first logic device configured to receive the output signal from the third latch, a signal obtained after buffering the output signal from the fourth latch, and the second latency enable signal, and perform a logical operation to the received signals, and a second logic device configured to receive the output signal from the first logic device and the second latency enable signal, and perform a logical operation to the output signal of the first logic device and the second latency enable signal.

The counter control signal generating circuit may further comprise an enable signal generator configured to receive the first and second latency signals, and generate the first and second latency enable signals. In this case, the enable signal generator may comprise a delay device for delaying the first latency signal for a predetermined period, a first buffer for buffering an output signal from the delay device, thereby generating the first latency enable signal, a logic unit configured to receive the output signal from the delay device and the second latency signal, and perform a logical operation to the received signals, and a second buffer for buffering an output signal from the logic unit, thereby generating the second latency enable signal.

The second detecting signal generator may comprise a latch unit comprising first to fourth latches, to sequentially latch the first command signal in response to an internal clock, a command signal generator comprising a first transfer device for transferring the first command signal, as the second command signal, in response to a first latency signal, a second transfer device for transferring an output signal from the second latch, as the second command signal, in response to a second latency signal, and a third transfer device for transferring an output signal from the fourth latch, as the second command signal, in response to a third latency signal, a signal transfer unit comprising a first transfer unit for transferring an output signal from the first latch, in response to a first latency enable signal, and a second transfer unit for transferring an output signal from the third latch in response to a second latency enable signal, and a detecting signal generator for configured to receive a signal obtained for buffering the write recognition signal and the signals transferred from the first and second transfer units, and perform a logical operation to the received signals, thereby generating the first detecting signal. The first latency enable signal may be enabled in response to the second and third latency signals. The second latency enable signal may be enabled in response to the third latency signal.

The first transfer unit may comprise a first logic device configured to receive the output signal from the first latch, a signal obtained after buffering the output signal from the second latch, and the first latency enable signal, and perform a logical operation to the received signals, and a second logic device configured to receive the output signal from the first logic device and the first latency enable signal, and perform a logical operation to the output signal of the first logic device and the first latency enable signal.

The second transfer unit may comprise a first logic device configured to receive the output signal from the third latch, a signal obtained after buffering the output signal from the fourth latch, and the second latency enable signal, and perform a logical operation to the received signals, and a second logic device configured to receive the output signal from the first logic device and the second latency enable signal, and perform a logical operation to the output signal of the first logic device and the second latency enable signal.

The counter control signal generating circuit may further comprise an enable signal generator configured to receive the first and second latency signals, and generate the first and second latency enable signals. In this case, the enable signal generator may comprise a delay device for delaying the first latency signal for a predetermined period, a first buffer for buffering an output signal from the delay device, thereby generating the first latency enable signal, a logic unit configured to receive the output signal from the delay device and the second latency signal, and perform a logical operation to the received signals, and a second buffer for buffering an output signal from the logic unit, thereby generating the second latency enable signal.

In another aspect of the present disclosure, a counter control signal generating circuit comprises a counter for counting a first counted address for a predetermined latency, thereby generating a second counted address, a counter control signal generator configured to receive a write recognition signal, which is enabled in response to a write command, and generate a counter control signal for controlling enabling of the counter, in response to the write recognition signal, and a detecting signal generator configured to receive the write recognition signal, generate a command signal obtained after counting of the write recognition signal for the predetermined latency, and generate a detecting signal, which is enabled in response to the write recognition signal.

In the counter control signal generating circuit of the present disclosure, whether or not a CAS latency (CL) counter should be operated is determined, based on only a write command, irrespective of a read command, in accordance with the above-described configuration. Accordingly, it is possible to prevent a current consumption caused by an operation of the CL counter unnecessarily carried out during a read operation. Also, when write commands are successively input, the operation of the CL counter is stopped by only the final write command. Accordingly, it is also possible to prevent the operation of the CL counter from being abnormally stopped.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF PREFERRED EMBODIMENTS

Preferred embodiments of the present disclosure will now be described in detail with reference to the accompanying drawings.

Figure 2:
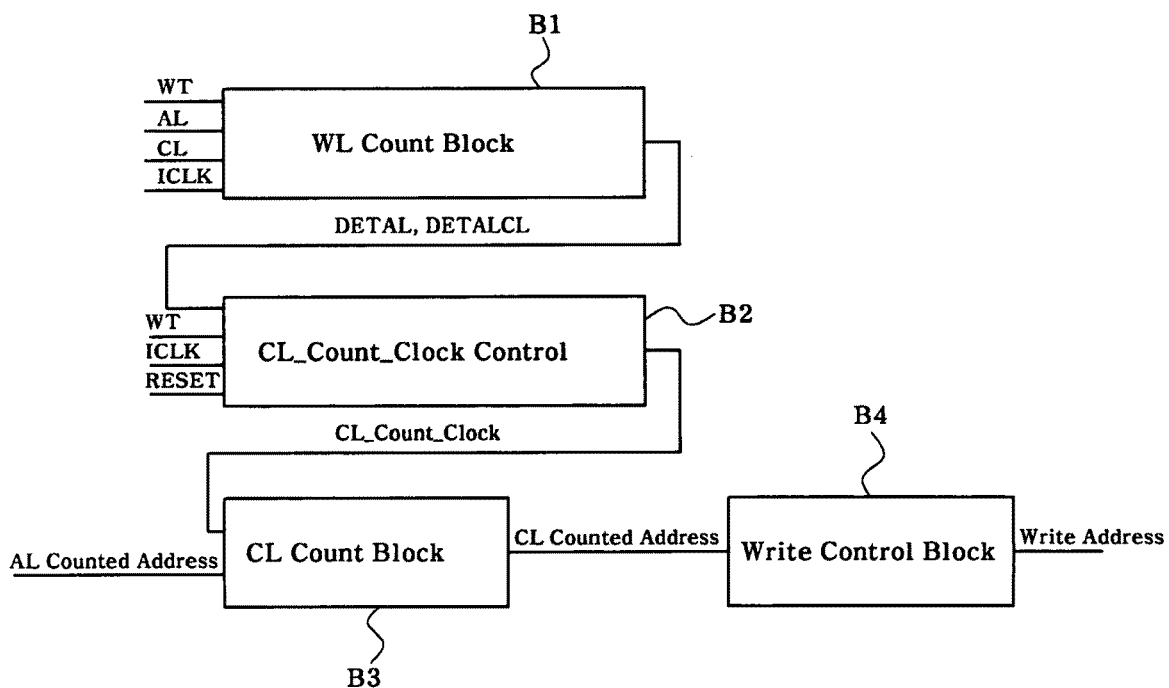
FIG. 2 is a block diagram illustrating a configuration of a read-write address generating circuit according to an exemplary embodiment of the present disclosure.

FIG. 2 is a block diagram illustrating a configuration of a read-write address generating circuit according to an exemplary embodiment of the present disclosure.

In the following description, "CL" designates a column address strobe (CAS) latency, "AL" designates an additive latency, "WL" designates a write latency, and "RL" designates a read latency.

The read-write address generating circuit of the illustrated embodiment includes a detecting signal generator (WL Count Block) B1, a counter control signal generator (CL_Count_Clock Control) B2, a CL counter (CL Count Block) B3, and a write address generator (Write Control Block) B4. No description will be given of an address latch unit (Address Latch Block) A1, an AL counter (AL Count Block) A2, and a read address generator (Read Control Block) A3, which will be referred to hereinafter, because they are constituent elements performing similar operations as those of the above-mentioned conventional case.

Figure 1A:
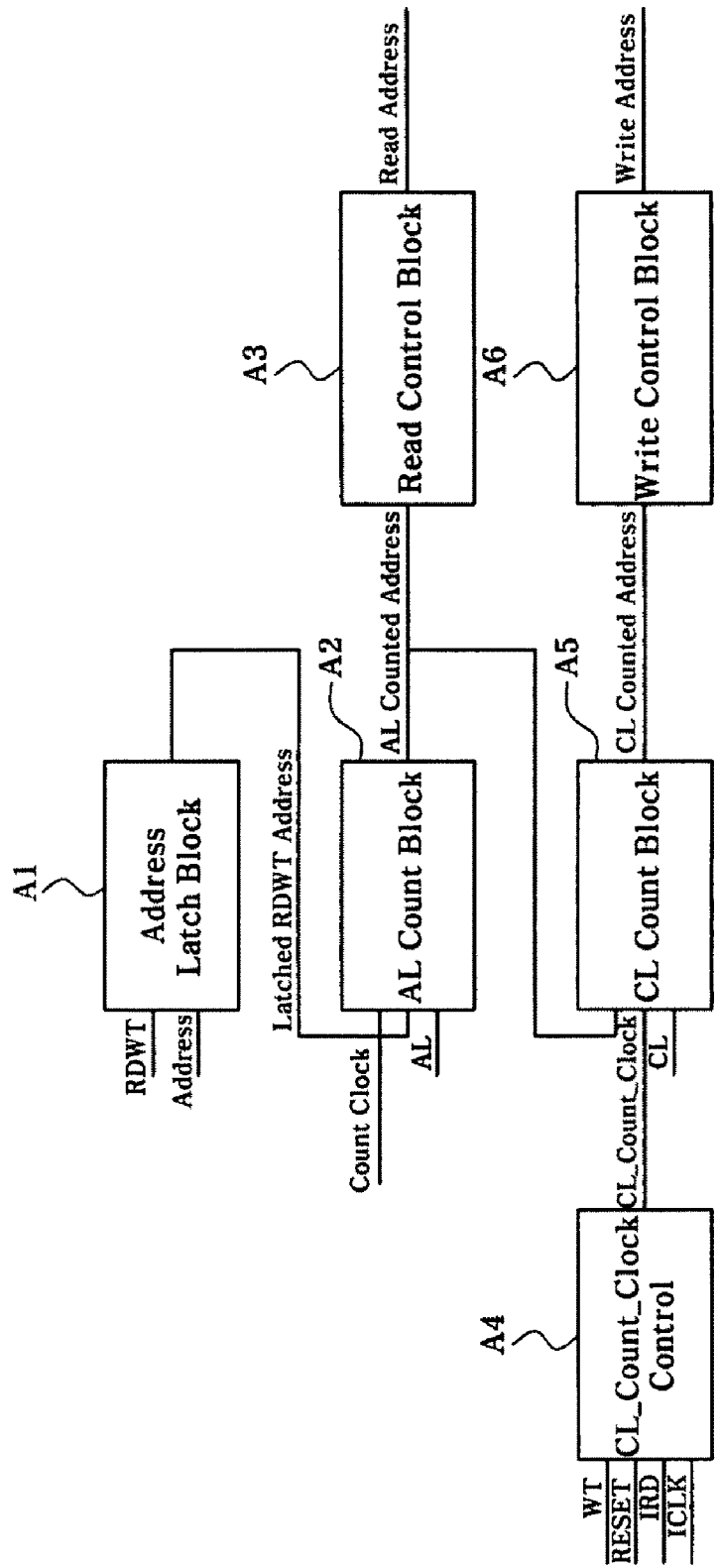
FIG. 1A is a block diagram illustrating a configuration of a conventional read-write address generating circuit.
Figure 1B:
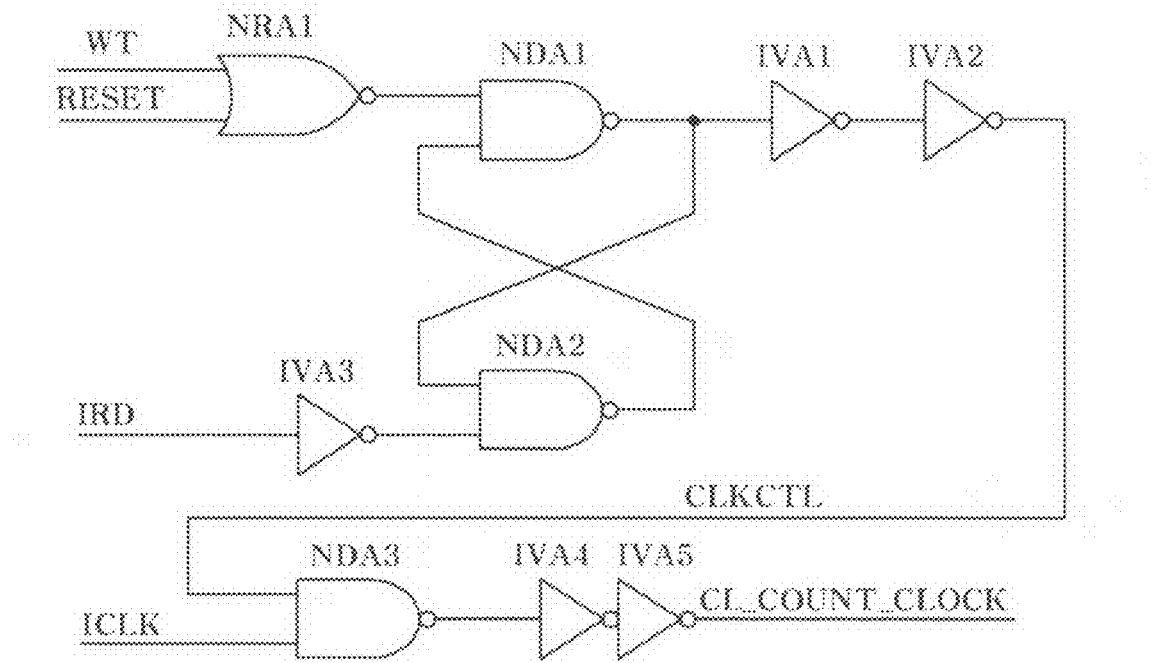
FIG. 1B is a circuit diagram illustrating a conventional counter control signal generator.
Figure 1C:
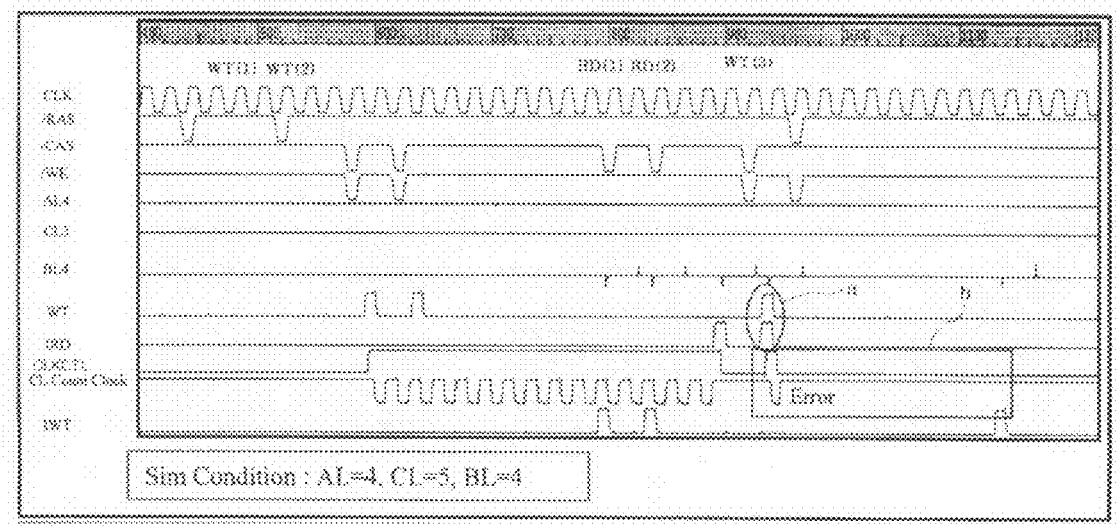
FIG. 1C is a timing diagram of internal signals of the conventional counter control signal generator.

The AL counter (not shown, but corresponding to the AL Count Block A2 of FIG. 1A) receives a latched external address signal Latched RDWT Address, and counts the latched external address signal Latched RDWT Address for a first latency, thereby generating an AL counted address signal AL Counted Address. The AL counted address signal AL Counted Address is input to the CL counter (CL Count Block) B3 which, in turn, counts AL counted address signal AL Counted Address for a CL, thereby generating a CL counted address signal CL Counted Address.

The counter control signal generator (CL_Count_Clock Control) B2 receives a write recognition signal WT, which is enabled in response to a write command, and generates, in response to the received write recognition signal WT, a counter control signal CL_Count_Clock for controlling enabling of the CL counter (CL Count Block) B3.

Figure 3:
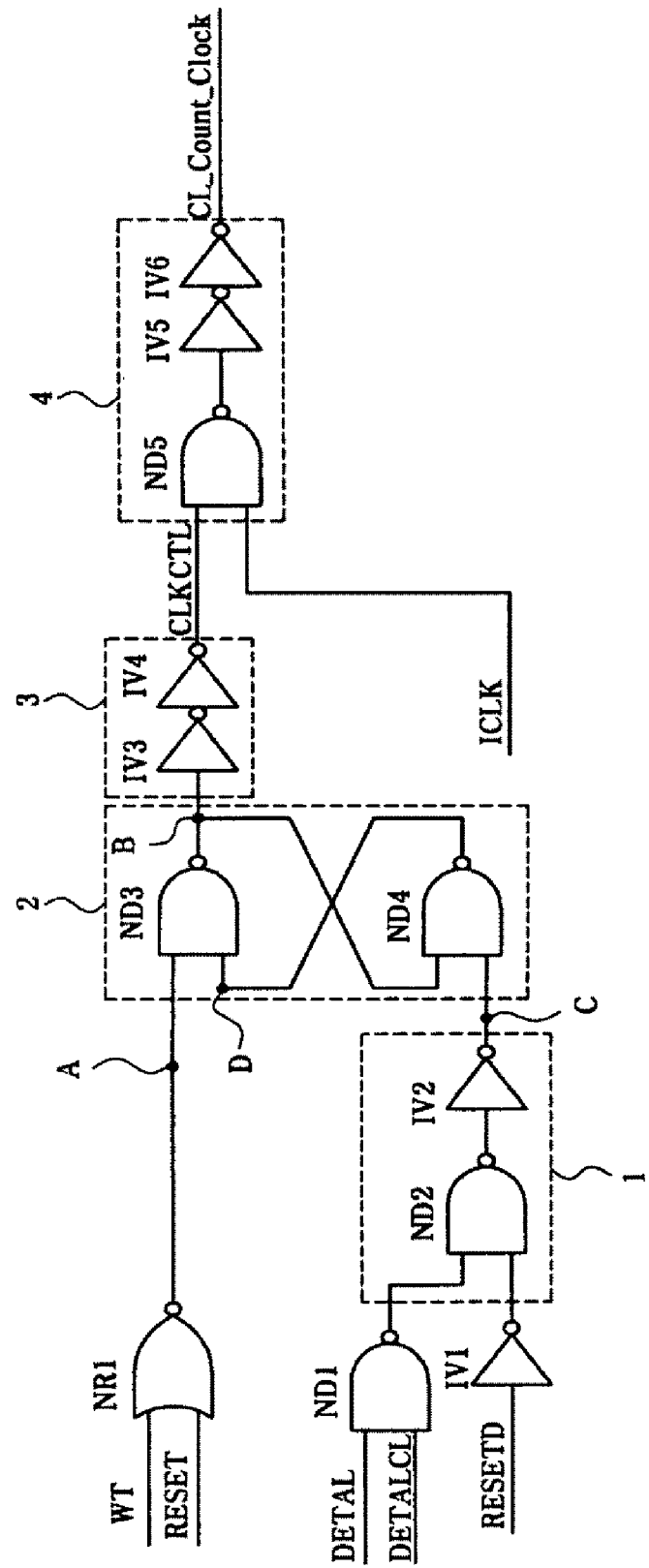
FIG. 3 is a circuit diagram illustrating a counter control signal generator according to an exemplary embodiment of the present disclosure.

This will be described in more detail with reference to FIG. 3. The counter control signal generator B2 includes a NOR gate NR1 configured to receive the write recognition signal WT, together with a reset signal RESET, and perform a NORing operation to the received signals, and a NAND gate ND1 configured to receive first and second detecting signals DETAL and DETALCL, and perform a NANDing operation to the received signals. The counter control signal generator B2 also includes a first logic unit 1 configured to receive an output signal from the NAND gate ND1 and a delayed reset signal RESETD obtained by delaying the reset signal RESET for a predetermined period, and perform an ANDing operation to the received signals. The first logic unit 1 includes a NAND gate ND2 and an inverter IV2. The counter control signal generator B2 further includes a latch unit 2 configured to receive output signals from the NOR gate NR1 and first logic unit 1, and latch the received signals. The latch unit 2 includes a plurality of NAND gates. In the case of FIG. 3, the latch unit 2 includes two NAND gates ND3 and ND4 receiving the output signals from the NOR gate NR1 and first logic unit 1, respectively. The counter control signal generator B2 further includes a second logic unit 4 configured to receive an enable signal CLKCTL obtained after delaying an output signal from the latch unit 2 for a predetermined period through a delay unit 3 including a plurality of inverters, together with an internal clock signal ICLK, and perform a NANDing operation to the received signal. The second logic unit 4 includes a NAND gate ND5 and a plurality of inverters. In the case of FIG. 3, the delay unit 3 includes two inverters IV3 and IV4. The second logic unit 4 includes two inverters IV5 and IV6.

Figure 4A:
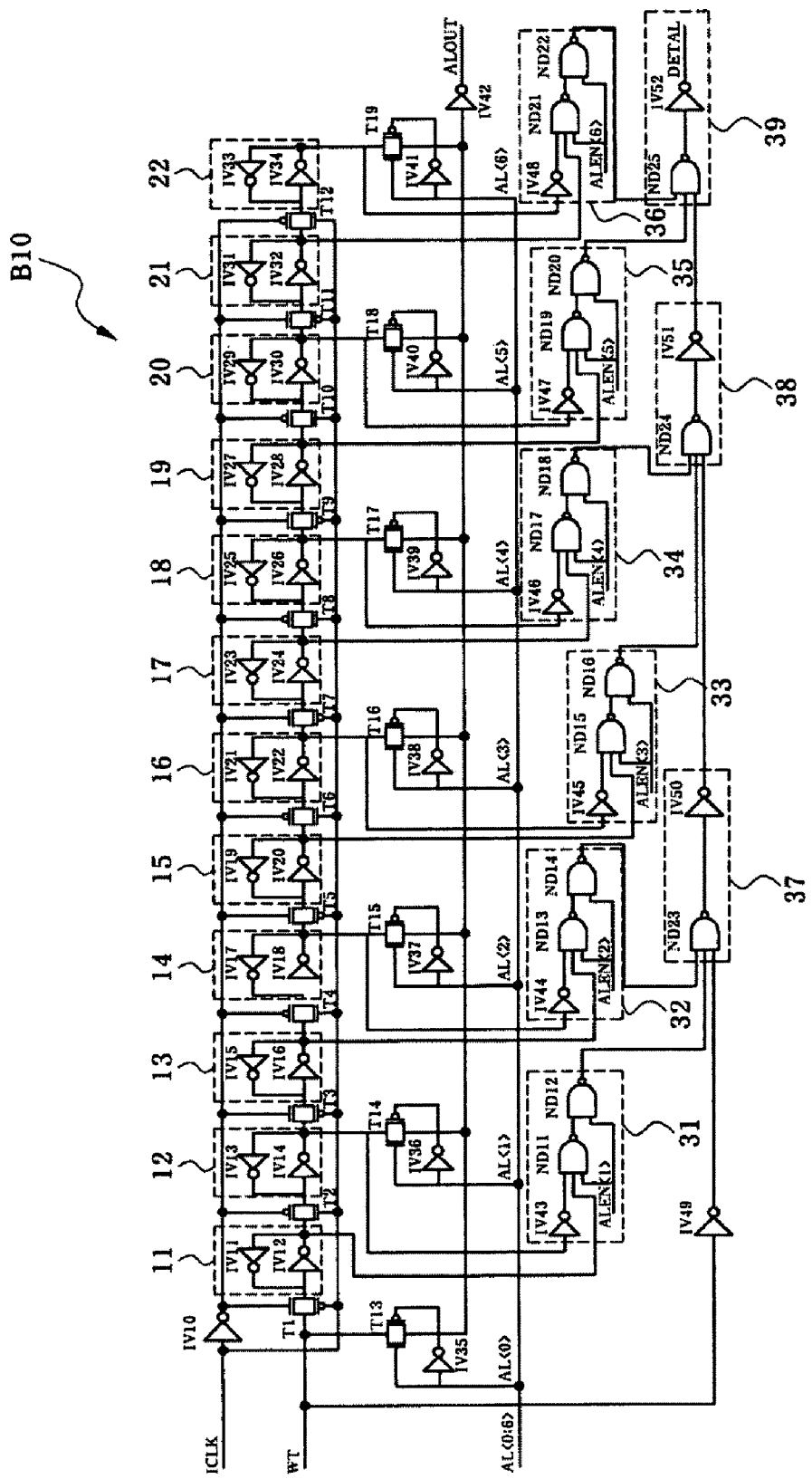
FIGS. 4A and 4C are circuit diagrams illustrating AL and CL detecting signal generators, respectively, according to an exemplary embodiment of the present disclosure.
Figure 4B:
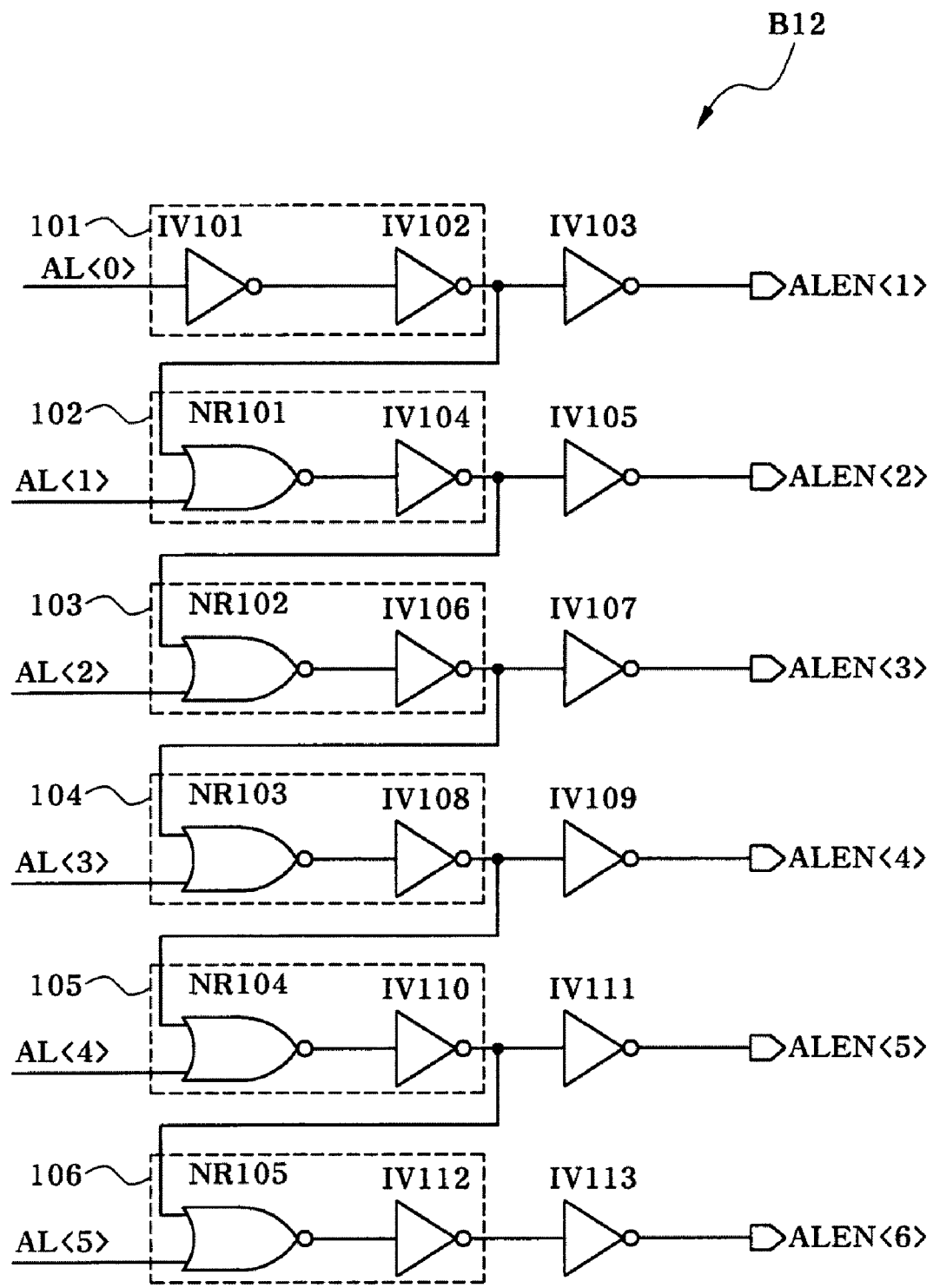
FIGS. 4B and 4D are circuit diagrams illustrating AL and CL enabling signal generators, respectively, according to an exemplary embodiment of the present disclosure, respectively.
Figure 4C:
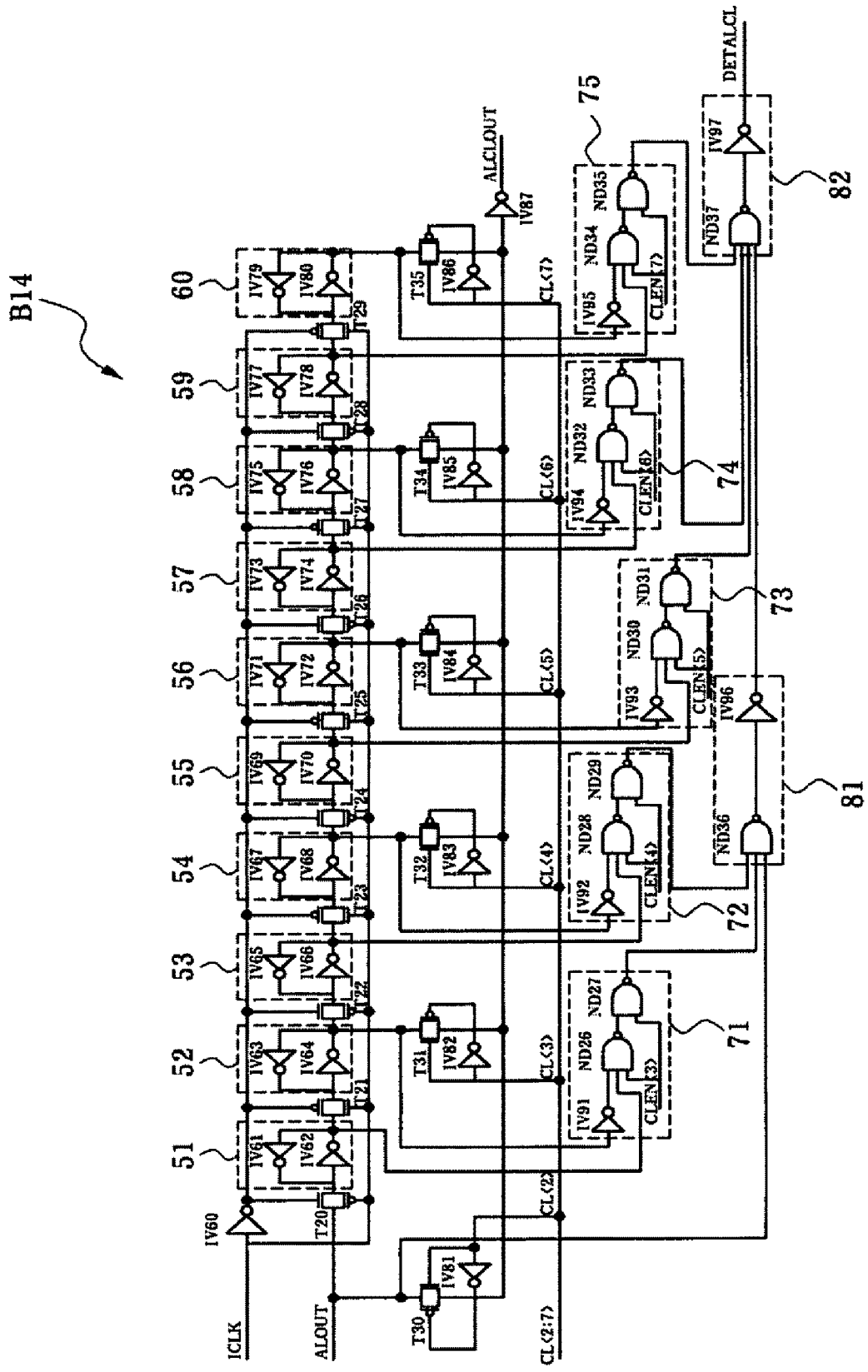

The detecting signal generator B1 includes an AL detecting signal generator B10 configured to receive the write recognition signal WT, AL signal, and internal clock signal ICLK, and generate the first detecting signal DETAL, as shown in FIG. 4A, and a CL detecting signal generator B14 configured to receive the CL signal and internal clock signal ICLK, and generate the second detecting signal DETALCL, as shown in FIG. 4C.

The AL detecting signal generator B10 receives the write recognition signal WT, and generates a first command signal ALOUT obtained after counting the write recognition signal WT for an AL. The AL detecting signal generator B10 also generates the first detecting signal DETAL which is enabled in response to the write recognition signal WT. This will be described in more detail with reference to FIG. 4A. The AL detecting signal generator B10 includes first to twelfth AL latches 11 to 22 including a plurality of inverters IV11 to IV34 and a plurality of transfer gates T1 to T12. The first to twelfth AL latches 11 to 22 are connected in series, to sequentially latch the write recognition signal WT in response to the internal clock signal ICLK. In the case of FIG. 4A, each of the first to twelfth AL latches 11 to 22 includes a pair of inverters and one transfer gate. For example, the first AL latch 11 includes the inverters IV11 and IV12, and the transfer gate T1. The AL detecting signal generator B10 also includes a plurality of AL transfer gates T13 to T19 for transferring the write recognition signal WT and output signals from the second, fourth, sixth, eighth, tenth, and twelfth AL latches 12, 14, 16, 18, 20, and 22 in response to zero-th to sixth AL signals AL<0:6>, respectively, as the first command signal ALOUT.

The AL detecting signal generator B10 further includes first to sixth AL transfer units 31 to 36. The first AL transfer unit 31 buffers the output signal from the first AL latch 11 or the output signal from the second AL latch 12, in response to a first AL enable signal ALEN<1>, and transfers the buffered signal. The first AL transfer unit 31 includes a NAND gate ND11 configured to receive the first AL enable signal ALEN<1>, the output signal from the first AL latch 11, and an inverted signal of the output signal from the second AL latch 12, and perform a NANDing operation to the received signals, and a NAND gate ND12 configured to receive an output signal from the NAND gate ND11 and the first AL enable signal ALEN<1>, and perform a NANDing operation to the received signals. The second to sixth AL transfer units 32 to 36 receive the second to sixth AL enable signals ALEN<2:6>, respectively, and transfer the output signals from the third to twelfth AL latches 13 to 22. Since the circuit configurations of the second to sixth AL transfer units 32 to 36 are substantially identical to that of the first AL transfer unit 31, no detailed description thereof will be given.

The AL detecting signal generator B10 further includes a first AL detecting signal generator 37 configured to receive a signal obtained after buffering the write recognition signal WT, an output signal from the first AL transfer unit 31, and an output signal from the second AL transfer unit 32, and perform an ANDing operation to the received signals. The first AL detecting signal generator 37 includes a NAND gate ND23 and an inverter IV50. The AL detecting signal generator B10 further includes a second AL detecting signal generator 38 configured to receive an output signal from the first AL detecting signal generator 37, an output signal from the third AL transfer unit 33, and an output signal from the fourth AL transfer unit 34, and perform an ANDing operation to the received signals. The second AL detecting signal generator 38 includes a NAND gate ND24 and an inverter IV51. The AL detecting signal generator B10 also includes a third AL detecting signal generator 39 configured to receive an output signal from the second AL detecting signal generator 38, an output signal from the fifth AL transfer unit 35, and an output signal from the sixth AL transfer unit 36, and perform an ANDing operation to the received signals. The third AL detecting signal generator 39 includes a NAND gate ND25 and an inverter IV52.

Referring to FIG. 4B, the AL enable signal generator B12, which generates the first to sixth AL enable signals ALEN<1:6>, includes a delay unit 101 including inverters IV101 and IV102, to delay the zero-th AL signal AL<0> for a predetermined period, an inverter IV103 for inverting an output signal from the delay unit 101, to generate the first AL enable signal ALEN<1>, a logic unit 102 including a NOR gate NR101 and an inverter IV104, to receive the output signal from the delay unit 101 and the first AL signal AL<1>, and to perform an ORing operation to the received signals, and an inverter IV105 for inverting an output signal from the logic unit 102, to generate the second AL enable signal ALEN<2>. The AL enable signal generator B12 also includes a logic unit 103 including a NOR gate NR102 and an inverter IV106, to receive the output signal from the logic unit 102 and the second AL signal AL<2>, and to perform an ORing operation to the received signals, an inverter IV107 for inverting an output signal from the logic unit 103, to generate the third AL enable signal ALEN<3>, a logic unit 104 including a NOR gate NR103 and an inverter IV108, to receive the output signal from the logic unit 103 and the third AL signal AL<3>, and to perform an ORing operation to the received signals, an inverter IV109 for inverting an output signal from the logic unit 104, to generate the fourth AL enable signal ALEN<4>, a logic unit 105 including a NOR gate NR104 and an inverter IV110, to receive the output signal from the logic unit 104 and the fourth AL signal AL<4>, and to perform an ORing operation to the received signals, an inverter IV111 for inverting an output signal from the logic unit 105, to generate the fifth AL enable signal ALEN<5>, a logic unit 106 including a NOR gate NR105 and an inverter IV112, to receive the output signal from the logic unit 105 and the fifth AL signal AL<5>, and to perform an ORing operation to the received signals, and an inverter IV113 for inverting an output signal from the logic unit 106, to generate the sixth AL enable signal ALEN<6>.

On the other hand, the CL detecting signal generator B14 receives the first command signal ALOUT, and generates a second command signal ALCLOUT obtained after counting the first command signal ALOUT for a CL. The CL detecting signal generator B14 also generates the second detecting signal DETALCL which is enabled in response to the first command signal ALOUT. This will be described in more detail with reference to FIG. 4C. The CL detecting signal generator B14 includes first to tenth CL latches 51 to 60 including a plurality of inverters IV61 to IV80 and a plurality of transfer gates T20 to T29. The first to tenth CL latches 51 to 60 are connected in series, to sequentially latch the first command signal ALOUT in response to the internal clock signal ICLK. In the case of FIG. 4C, each of the first to tenth CL latches 51 to 60 includes a pair of inverters and one transfer gate. For example, the first CL latch 51 includes the inverters IV61 and IV62, and the transfer gate T20. The CL detecting signal generator B14 also includes a plurality of CL transfer gates T30 to T35 for transferring the first command signal ALOUT and output signals from the second, fourth, sixth, eighth, and tenth CL latches 52, 54, 56, 58, and 60 in response to second to seventh CL signals CL<2:7>, respectively, as the second command signal ALCLOUT.

The CL detecting signal generator B14 further includes first to fifth CL transfer units 71 to 75. The first CL transfer unit 71 transfers the output signal from the first CL latch 51 or an inverted signal of the output signal from the second CL latch 52 in response to a third CL enable signal CLEN<3>.

The first CL transfer unit 71 includes a NAND gate ND26 configured to receive the third CL enable signal CLEN<3>, the output signal from the first CL latch 51, and the inverted signal of the output signal from the second CL latch 52, and perform a NANDing operation to the received signals, and a NAND gate ND27 configured to receive an output signal from the NAND gate ND26 and the third CL enable signal ALEN<3>, and perform a NANDing operation to the received signals. The second to fifth CL transfer units 72 to 75 receive the fourth to seventh CL enable signals CLEN<4:7>, respectively, and transfer the output signals from the third to tenth CL latches 53 to 60. Since the circuit configurations of the second to fifth CL transfer units 72 to 75 are substantially identical to that of the first CL transfer unit 71, no detailed description thereof will be given.

The CL detecting signal generator B14 further includes a first CL detecting signal generator 81 configured to receive the first command signal ALOUT, an output signal from the first CL transfer unit 71, and an output signal from the second CL transfer unit 72, and perform an ANDing operation to the received signal. The first CL detecting signal generator 81 includes a NAND gate ND36 and an inverter IV96. The CL detecting signal generator B14 further includes a second CL detecting signal generator 82 configured to receive an output signal from the first CL detecting signal generator 81, an output signal from the third CL transfer unit 73, an output signal from the fourth CL transfer unit 74, and an output signal from the fifth CL transfer unit 75, and perform an ANDing operation to the received signals. The second CL detecting signal generator 82 includes a NAND gate ND37 and an inverter IV97.

Figure 4D:
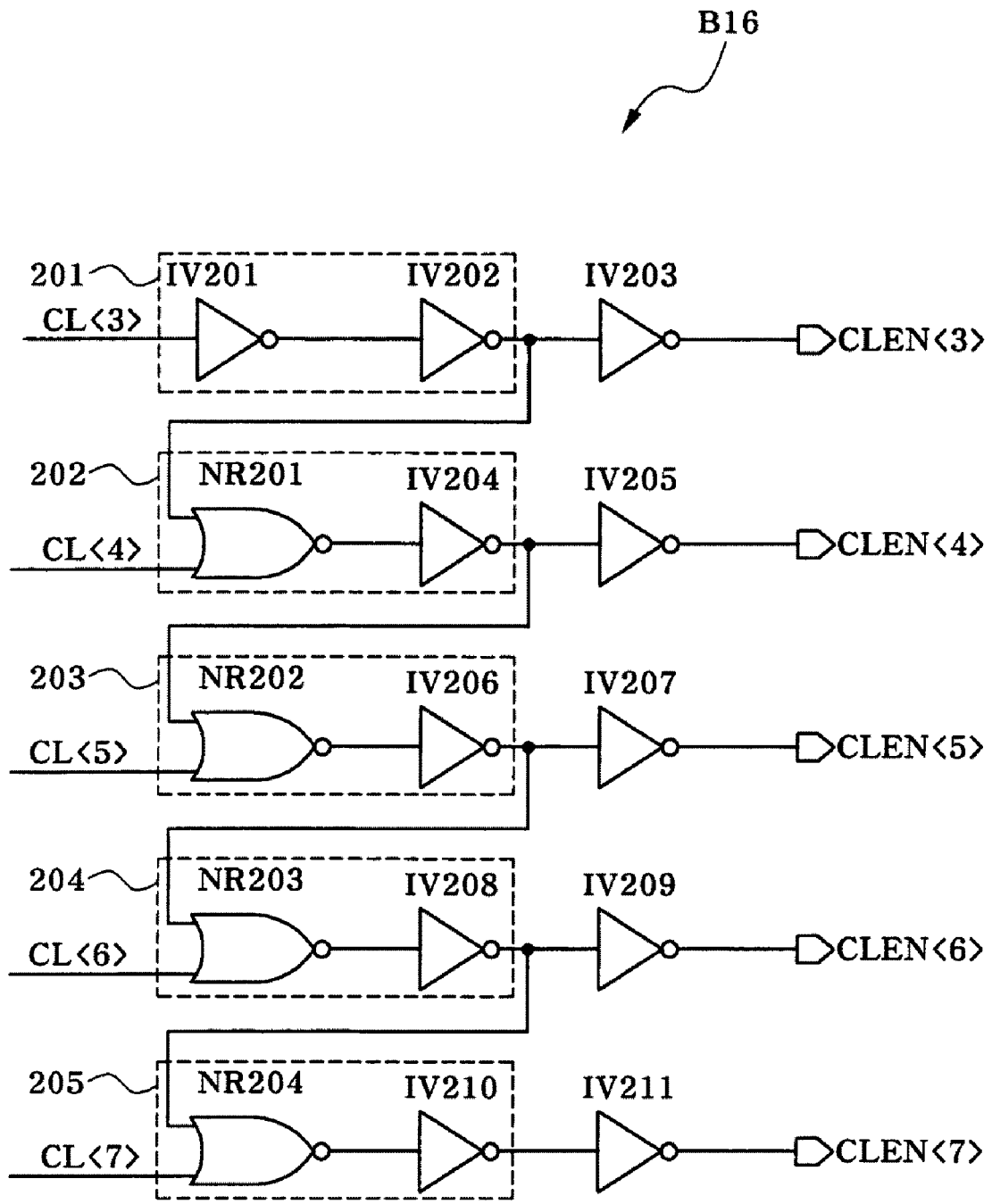

Referring to FIG. 4D, the CL enable signal generator B16, which generates the third to seventh CL enable signals CLEN<3:7>, includes a delay unit 201 including inverters IV201 and IV202, to delay the third CL signal CL<3> for a predetermined period, an inverter IV203 for inverting an output signal from the delay unit 201, to generate the third CL enable signal CLEN<3>, a logic unit 202 including a NOR gate NR201 and an inverter IV204, to receive the output signal from the delay unit 201 and the fourth CL signal CL<4>, and to perform an ORing operation to the received signals, and an inverter IV205 for inverting an output signal from the logic unit 202, to generate the fourth CL enable signal CLEN<4>. The CL enable signal generator B16 also includes a logic unit 203 including a NOR gate NR202 and an inverter IV206, to receive the output signal from the logic unit 202 and the fifth CL signal CL<5>, and to perform an ORing operation to the received signals, an inverter IV207 for inverting an output signal from the logic unit 203, to generate the fifth CL enable signal CLEN<5>, a logic unit 204 including a NOR gate NR203 and an inverter IV208, to receive the output signal from the logic unit 203 and the sixth CL signal CL<6>, and to perform an ORing operation to the received signals, an inverter IV209 for inverting an output signal from the logic unit 204, to generate the sixth CL enable signal CLEN<6>, a logic unit 205 including a NOR gate NR204 and an inverter IV210, to receive the output signal from the logic unit 204 and the seventh CL signal CL<7>, and to perform an ORing operation to the received signals, and an inverter IV211 for inverting an output signal from the logic unit 205, to generate the seventh CL enable signal CLEN<7>.

Hereinafter, operation of the read-write address generating circuit having the above-described configuration will be described in detail. In the following description, operations identical to those of the above-mentioned conventional case will be described only in brief. The following description is provided mainly in conjunction with operations of the detecting signal generator B1, and counter control signal generator (CL_Count_Clock Control Block) B2 shown in FIGS. 4A to 4D.

First, the AL enable signal generator B12 shown in FIG. 4B generates the first to sixth AL enable signals ALEN<1:6>. Also, the CL enable signal generator B16 shown in FIG. 4D generates the third to seventh CL enable signals CLEN<3:7>.

For example, when the AL is set to 2, only the second AL signal AL<2> is enabled. In this case, the second AL signal AL<2> has a high level, whereas the zero-th and first AL signals AL<0:1> and the third to fifth AL signals <3:5> have a low level. In this case, accordingly, the first and second AL enable signals ALEN<1:2> are enabled, namely, are transited to a high level, whereas the third to sixth AL enable signals ALEN<3:6> are disabled, namely, are transited to a low level. That is, the AL enable signal generator B12 generates first and second AL enable signals ALEN<1:2> transited to an enable state, namely, a high level, in response to the second AL signal AL<2> having a high level. If the AL is set to 3, and thus the third AL signal AL<3> is enabled, the first to third AL enable signals ALEN<1:3> are enabled.

Similarly, when CL is set to 5, only the fifth CL signal CL<5> is enabled. In this case, the fifth CL signal CL<5> has a high level, whereas the third and fourth CL signals CL<3:4> and the sixth and seventh CL signals <6:7> have a low level. In this case, accordingly, the third and fourth CL enable signals CLEN<3:4> are enabled (namely, are transited to a high level), whereas the fifth and seventh CL enable signals CLEN<5:7> are disabled (namely, are transited to a low level). That is, the CL enable signal generator B16 generates third and fourth CL enable signals CLEN<3:4> transited to an enable state in response to the enabled fifth CL signal CL<5>. If CL is set to 6, and thus, the sixth CL signal CL<6> is enabled, the third to fifth CL enable signals CLEN<3:5> are enabled.

Next, the AL detecting signal generator B10 shown in FIG. 4A receives the zero-th to sixth AL signals AL<0:6>, and generates the first command signal ALOUT. In detail, for example, under the condition in which AL has been set to 2, only the second AL signal AL<2> is enabled, namely, is transited to a high level. In this case, the third AL transfer gate T15 is turned on, whereas the first and second AL transfer gates T13 and T14, and the fourth to seventh AL transfer gates T16 to T19 are turned off. Accordingly, the write recognition signal WT, which is enabled in response to a write command, is latched by the first to twelfth AL latches 11 to 22 in response to the internal clock ICLK. At this time, the output signal from the fourth AL latch 14 is output through the turned-on third AL transfer gate T15 and inverter IV42, as the first command signal ALOUT. The output first command signal ALOUT is a signal obtained after latenting the write recognition signal WT by an AL of 2. That is, the first command signal ALOUT is a command signal to which a certain latency has been applied in addition to a given address.

As shown in FIG. 4A, the AL detecting signal generator B10 also receives the first to sixth AL enable signals ALEN<0:6>, and generates the first detecting signal DETAL. Hereinafter, an operation for generating the first detecting signal DETAL will be described.

First, when a first write command is input, the write recognition signal WT, which is input to the AL detecting signal generator B10, is transited to an enable state, namely, a high level state, in response to the first write command. The write recognition signal WT is then inverted to a low-level signal by the inverter IV49 which, in turn, applies the low-level signal to the first AL detecting signal generator 37. As a result, the first AL detecting signal generator 37 outputs a low-level signal. Accordingly, the second AL detecting signal generator 38 outputs a low-level signal, and thus, the third AL detecting signal generator 39 outputs a signal of a low level state, namely, an enable state, as the first detecting signal DETAL. The enable period of the first detecting signal DETAL, which is enabled in response to a write command, is controlled to be maintained until the first command signal ALOUT is generated. Accordingly, when no second write command is input until the first command signal ALOUT is generated, the first detecting signal DETAL is then transited to a high level, namely, is disabled. The enable period of the first detecting signal DETAL can be controlled by adjusting the number of AL latches.

Next, when a second write command is input before the generation of the first command signal ALOUT, the write recognition signal WT is enabled in response to the second write command. The enabled write recognition signal WT is latched by the first to twelfth latches 11 to 22. If the AL has been set to 2, the AL enable signal generator B12 generates the first and second AL enable signals ALEN<1:2>, which are in a high level state, namely, an enable state, as described. As a result, the NAND gates ND11 to ND14 of the first and second AL transfer units 31 and 32 operate as inverters. Accordingly, the first AL transfer unit 31, which transfers the output signal from the first AL latch 11 or an inverted signal of the output signal from the second AL latch 12, outputs a low-level signal. Similarly, the second AL transfer unit 32 outputs a low-level signal. The first AL detecting signal generator 37, which receives the low-level signals from the first and second AL transfer units 31 and 32, outputs a low level signal. As a result, the third AL detecting signal generator 39 maintains the first detecting signal DETAL at a low level state.

Meanwhile, the CL detecting signal generator B14 shown in FIG. 4C receives the second to seventh CL signals CL<2:7>, and generates the second command signal ALCLOUT. In detail, for example, under the condition in which CL has been set to 5, only the fifth CL signal CL<5> is enabled, namely, is transited to a high level. In this case, the fourth CL transfer gate T33 is turned on, whereas the first to third CL transfer gates T30 to T32, and the fifth and sixth CL transfer gates T34 and T35 are turned off. Accordingly, the first command signal ALOUT is latched by the first to tenth CL latches 51 to 60 in response to the internal clock ICLK. At this time, the output signal from the sixth CL latch 56 is output through the turned-on fourth CL transfer gate T33 and inverter IV87, as the second command signal ALCLOUT. The output second command signal ALCLOUT is a signal obtained after latenting the first command signal ALOUT by a CL of 5. That is, the first command signal CLOUT is a command signal to which a certain latency has been applied in addition to a given address.

As shown in FIG. 4C, the CL detecting signal generator B14 also receives the third to seventh CL enable signals CLEN<3:7>, and generates the second detecting signal DETALCL. Hereinafter, an operation for generating the second detecting signal DETALCL will be described.

First, when a first write command is input, the first command signal ALOUT is transited to an enable state, namely, a low level state, in response to the first write command. The first command signal ALOUT is input to the first CL detecting signal generator 81 which, in turn, outputs a low-level signal. Accordingly, the second CL detecting signal generator 82 outputs a signal of a low level state, namely, an enable state, as the second detecting signal DETALCL. The enable period of the second detecting signal DETALCL, which is enabled in response to a write command, is preferably controlled to be maintained until the second command signal ALCLOUT is generated.

Next, when a second write command is input before the generation of the second command signal ALCLOUT, the first command signal ALOUT is enabled in response to the second write command. The enabled first command signal ALOUT is latched by the first to tenth latches 51 to 60. If CL has been set to 5, the CL enable signal generator B16 generates the third and fourth CL enable signals CLEN<3:4>, which are in a high level state, namely, an enable state, as described. As a result, the NAND gates ND26 to ND29 of the first and second CL transfer units 71 and 72 operate as inverters. Accordingly, the first CL transfer unit 71, which transfers the output signal from the first CL latch 51 or an inverted signal of the output signal from the second CL latch 52, outputs a low-level signal. Similarly, the second CL transfer unit 72 outputs a low-level signal. The first CL detecting signal generator 81, which receives the low-level signals from the first and second CL transfer units 71 and 72, outputs a low level signal. As a result, the second CL detecting signal generator 82 maintains the second detecting signal DETALCL at a low level state.

Thus, when the second write command is input after the inputting of the first write command, but before the generation of the second command signal ALCLOUT, at least one of the first detecting signal DETAL and second detecting signal DETALCL is maintained at a low level state, namely, an enable state, in accordance with the second write command.

The first detecting signal DETAL and second detecting signal DETALCL having such characteristics are input to the counter control signal generator B2 shown in FIG. 3, so that they are used to generate the counter control signal CL_Count_Clock for controlling enabling of the CL counter B3. Hereinafter, operation of the counter control signal generator B2 will be described with reference to FIG. 3. Here, the reset signal RESET is a signal which has a high level at an initial stage of a reset mode, and is subsequently transited to a low level, whereas the delayed reset signal RESETD is a signal delayed from the reset signal RESET for a predetermined period.

At the initial stage of the reset mode, a node A is reset to a low level, and a node B is reset to a high level, because the reset signal RESET has a high level. As the delayed reset signal RESETD is subsequently transited to a high level, a node C is reset to a low level, and a node D is reset to a high level. When the reset signal RESET is subsequently transited to a low level, the node A is transited to a high level, so that the node B is transited to a low level. The node D is maintained in a high level state, in accordance with the low level of the node B. The low level state of the node B is maintained until a write recognition signal WT is input in accordance with a write command, because the node A is maintained in a high level state. Thus, the node B is reset to a low level in accordance with the reset signal RESET and delayed reset signal RESETD. In the reset mode, accordingly, the counter control signal CL_Count_Clock has a high level, so that it disables the CL counter B3.

Next, the case, in which a write command is input after the reset mode, will be described. When a write command is input, the write recognition signal WT is transited to a high level, namely, is enabled. In accordance with the high-level write recognition signal WT, the node A is transited to a low level state, and the node B is transited to a high level state. Accordingly, the enable signal CLKCTL has a high level. As a result, an inverted clock of the internal clock ICLK is output as the counter control signal CL_Count_Clock, so that the CL counter B3 is enabled.

Meanwhile, in accordance with the inputting of the write command, at least one of the first detecting signal DETAL and second detecting signal DETALCL is maintained at a low level state, namely, an enable state, until the second command signal ALCLOUT is generated, as described above. In response to the first detecting signal DETAL or second detecting signal DETALCL, which has a low level, the node C is transited to a high level, so that the node D is transited to a low level (At this time, the node B is transited to a high level in accordance with the enabling of the write recognition signal WT.). When the node D has a low level, the node B has a high level, irrespective of the level of the node A. In this state, the inverted clock of the internal clock ICLK is output as the counter control signal CL_Count_Clock, so that the CL counter B3 is maintained in an enable state. This state is maintained for a period in which the first detecting signal DETAL and second detecting signal DETALCL are maintained in a low level state, namely, until the second command signal ALCLOUT is generated. Following the generation of the second command signal ALCLOUT, the first detecting signal DETAL and second detecting signal DETALCL are transited to a high level, so that the node C is transited to a low level, thereby causing the node D to be transited to a high level. As a result, the counter control signal CL_Count_Clock is transited to a high level, thereby disabling the CL counter B3.

As described above, the enabling of the counter control signal CL_Count_Clock generated from the counter control signal generator B2 is determined by the write recognition signal WT and first and second detecting signals DETAL and DETALCL, which are enabled in accordance with a write command. Accordingly, it is possible to prevent a current consumption phenomenon caused by an operation of the CL counter B3 unnecessarily carried out in response to a read command.

Figure 5A:
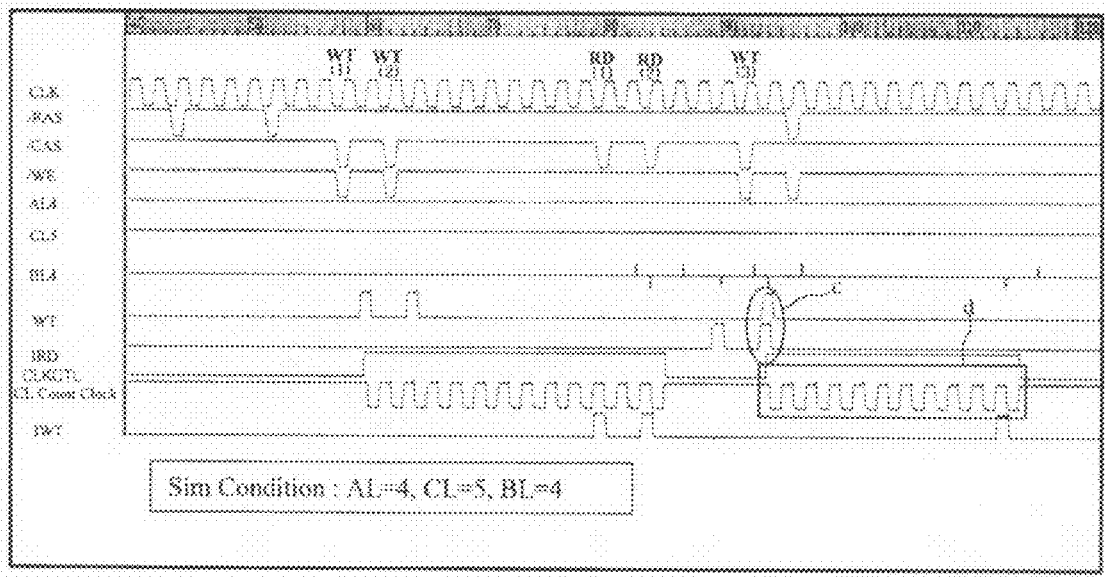
FIGS. 5A and 5B are timing diagrams of internal signals of the counter control signal generator according to the illustrated embodiment of the present disclosure.
Figure 5B:
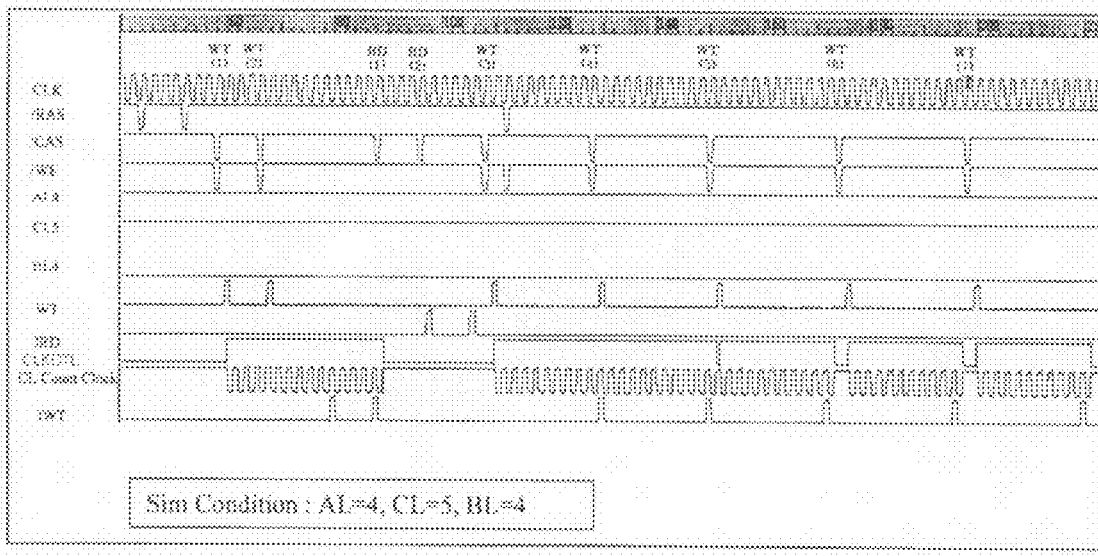

Meanwhile, if the AL is 4, as shown in FIG. 5A, the enable period of a write recognition signal WT generated in accordance with a write command WT(3) may overlap with the enable period of a read recognition signal IRD generated in accordance with a read command RD(2), as indicated by a circle c in FIG. 5A. However, the subject matter of this disclosure can prevent the operation of the CL counter B3 from being abnormally stopped, because the enable period of the counter control signal CL_Count_Clock is determined by only the write recognition signal WT and first and second detecting signals DETAL and DETALCL As described above, in the case in which the second write command is input before the generation of the second command signal ALCLOUT, at least one of the first detecting signal DETAL and second detecting signal DETALCL is maintained in a low level state until the second command signal ALCLOUT according to the second write command is generated. Accordingly, the enable period of the counter control signal CL_Count_Clock is extended to the point of time when the second command signal ALCLOUT according to the second write command is generated. That is, even when write commands are successively input, the counter control signal CL_Count_Clock generated from the counter control signal generator B2 according to the present disclosure is maintained in an enable state until the second command signal ALCLOUT according to the final write command is generated. Accordingly, it is possible to prevent the operation of the CL counter B3 from being abnormally stopped.

Although preferred embodiments of the disclosure have been disclosed for illustrative purposes, those skilled in the art will appreciate that various modifications, additions and substitutions are possible, without departing from the scope and spirit of the disclosure as disclosed in the accompanying claims.

The present application claims priority to Korean patent application number 10-2006-105249, filed on Oct. 27, 2006, which is incorporated in its entirety by reference herein.

What is claimed is:

1. A counter control signal generating circuit comprising:
  a first counter configured to receive a latched external address, and count the latched external address for a first latency, thereby generating a first counted address;
  a second counter configured to count the first counted address for a second latency, thereby generating a second counted address;
  a counter control signal generator configured to receive a write recognition signal, which is enabled in response to a write command, and generate a counter control signal for controlling enabling of the second counter, in response to the write recognition signal;
  a first detecting signal generator configured to receive the write recognition signal, generate a first command signal obtained after counting of the write recognition signal for the first latency, and generate a first detecting signal, which is enabled in response to the write recognition signal; and
  a second detecting signal generator configured to receive the first command signal, generate a second command signal obtained after counting of the first command signal for the second latency, and generate a second detecting signal, which is enabled in response to the first command signal.

2. The counter control signal generating circuit according to claim 1, wherein the counter control signal is enabled in response to the first detecting signal and the second detecting signal.

3. The counter control signal generating circuit according to claim 1, wherein at least one of the first and second detecting signals is maintained in an enable state until the second command signal is generated.

4. The counter control signal generating circuit according to claim 1, wherein the counter control signal generator comprises:
  a first logic device configured to receive the write recognition signal and a first reset signal, and perform a first logical operation to the write recognition signal and the first reset signal;
  a second logic device configured to receive the first and second detecting signals, and perform a second logical operation to the first and second detecting signals;
  a first logic unit configured to receive an output signal from the second logic device and a second reset signal delayed from the first reset signal for a predetermined period, and perform a third logical operation to the output signal of the second logic device and the second reset signal;
  a latch unit configured to receive and latch an output signal from the first logic device and an output signal from the first logic unit; and
  a second logic unit configured to receive a signal delayed from an output signal from the latch unit for a predetermined period and an internal clock, and perform a fourth logical operation to the delayed signal and the internal clock, thereby generating the counter control signal.

5. The counter control signal generating circuit according to claim 1, wherein the first detecting signal generator comprises:
- a latch unit comprising first to fourth latches, which are connected in series, to sequentially latch the write recognition signal in response to an internal clock;
- a command signal generator comprising a first transfer device for transferring the write recognition signal, as the first command signal, in response to a first latency signal, a second transfer device for transferring an output signal from the second latch, as the first command signal, in response to a second latency signal, and a third transfer device for transferring an output signal from the fourth latch, as the first command signal, in response to a third latency signal;
- a signal transfer unit comprising a first transfer unit for transferring an output signal from the first latch, in response to a first latency enable signal, and a second transfer unit for transferring an output signal from the third latch in response to a second latency enable signal; and
- a detecting signal generator configured to receive a signal obtained for buffering the write recognition signal and the signals transferred from the first and second transfer units, and perform a logical operation to the received signals, thereby generating the first detecting signal,
- wherein the first latency enable signal is enabled in response to the second or third latency signal, and the second latency enable signal is enabled in response to the third latency signal.

6. The counter control signal generating circuit according to claim 5, wherein the first transfer unit comprises:
- a first logic device configured to receive the output signal from the first latch, a signal obtained after buffering the output signal from the second latch, and the first latency enable signal, and perform a first logical operation to the received signals; and
- a second logic device configured to receive the output signal from the first logic device and the first latency enable signal, and perform a second logical operation to the output signal of the first logic device and the first latency enable signal.

7. The counter control signal generating circuit according to claim 5, wherein the second transfer unit comprises:
- a first logic device configured to receive the output signal from the third latch, a signal obtained after buffering the output signal from the fourth latch, and the second latency enable signal, and perform a first logical operation to the received signals; and
- a second logic device configured to receive the output signal from the first logic device and the second latency enable signal, and perform a second logical operation to the output signal of the first logic device and the second latency enable signal.

8. The counter control signal generating circuit according to claim 5, further comprising:
- an enable signal generator configured to receive the first and second latency signals, and generate the first and second latency enable signals,
- wherein the enable signal generator comprises:
- a delay device for delaying the first latency signal for a predetermined period;
- a first buffer for buffering an output signal from the delay device, thereby generating the first latency enable signal;
- a logic unit configured to receive the output signal from the delay device and the second latency signal, and perform a logical operation to the received signals; and
- a second buffer for buffering an output signal from the logic unit, thereby generating the second latency enable signal.

9. The counter control signal generating circuit according to claim 1, wherein the second detecting signal generator comprises:
- a latch unit comprising first to fourth latches, to sequentially latch the first command signal in response to an internal clock;
- a command signal generator comprising a first transfer device for transferring the first command signal, as the second command signal, in response to a first latency signal, a second transfer device for transferring an output signal from the second latch, as the second command signal, in response to a second latency signal, and a third transfer device for transferring an output signal from the fourth latch, as the second command signal, in response to a third latency signal;
- a signal transfer unit comprising a first transfer unit for transferring an output signal from the first latch, in response to a first latency enable signal, and a second transfer unit for transferring an output signal from the third latch in response to a second latency enable signal; and
- a detecting signal generator configured to receive a signal obtained for buffering the write recognition signal and the signals transferred from the first and second transfer units, and perform a logical operation to the received signals, thereby generating the second detecting signal,
- wherein the first latency enable signal is enabled in response to the second and third latency signals, and the second latency enable signal is enabled in response to the third latency signal.

10. The counter control signal generating circuit according to claim 9, wherein the first transfer unit comprises:
- a first logic device configured to receive the output signal from the first latch, a signal obtained after buffering the output signal from the second latch, and the first latency enable signal, and perform a first logical operation to the received signals; and
- a second logic device configured to receive the output signal from the first logic device and the first latency enable signal, and perform a second logical operation to the output signal of the first logic device and the first latency enable signal.

11. The counter control signal generating circuit according to claim 9, wherein the second transfer unit comprises:
- a first logic device configured to receive the output signal from the third latch, a signal obtained after buffering the output signal from the fourth latch, and the second latency enable signal, and perform a first logical operation to the received signals; and
- a second logic device configured to receive the output signal from the first logic device and the second latency enable signal, and perform a second logical operation to the output signal of the first logic device and the second latency enable signal.

12. The counter control signal generating circuit according to claim 9, further comprising:
- an enable signal generator configured to receive the first and second latency signals, and generate the first and second latency enable signals,
- wherein the enable signal generator comprises:

a delay device for delaying the first latency signal for a predetermined period;
a first buffer for buffering an output signal from the delay device, thereby generating the first latency enable signal;
a logic unit configured to receive the output signal from the delay device and the second latency signal, and perform a logical operation to the received signals; and
a second buffer for buffering an output signal from the logic unit, thereby generating the second latency enable signal.

13. A counter control signal generating circuit comprising:
a counter configured to count a first counted address for a predetermined latency, thereby generating a second counted address;
a counter control signal generator configured to receive a write recognition signal, which is enabled in response to a write command, and generate a counter control signal for controlling enabling of the counter, in response to the write recognition signal; and
a detecting signal generator configured to receive the write recognition signal, generate a command signal obtained after counting of the write recognition signal for the predetermined latency, and generate a detecting signal, which is enabled in response to the write recognition signal.

14. The counter control signal generating circuit according to claim 13, wherein the counter control signal is enabled in response to the detecting signal.

15. The counter control signal generating circuit according to claim 13, wherein the detecting signal is maintained in an enable state until the command signal is generated.

16. The counter control signal generating circuit according to claim 13, wherein the counter control signal generator comprises:
a first logic device configured to receive the write recognition signal and a first reset signal, and perform a first logical operation to the write recognition signal and the first reset signal;
a second logic device configured to receive and buffer the detecting signal;
a first logic unit configured to receive an output signal from the second logic device and a second reset signal delayed from the first reset signal for a predetermined period, and perform a second logical operation to the output signal of the second logic device and the second reset signal;
a latch unit configured to receive and latch an output signal from the first logic device and an output signal from the first logic unit; and
a second logic unit configured to receive a signal delayed from an output signal from the latch unit for a predetermined period and an internal clock, and perform a third logical operation to the delayed signal and the internal clock, thereby generating the counter control signal.

17. The counter control signal generating circuit according to claim 13, wherein the detecting signal generator comprises:
a latch unit comprising first to fourth latches, which are connected in series, to sequentially latch the write recognition signal in response to an internal clock;
a command signal generator comprising a first transfer device for transferring the write recognition signal, as the command signal, in response to a first latency signal, a second transfer device for transferring an output signal from the second latch, as the command signal, in response to a second latency signal, and a third transfer device for transferring an output signal from the fourth latch, as the command signal, in response to a third latency signal;
a signal transfer unit comprising a first transfer unit for transferring an output signal from the first latch, in response to a first latency enable signal, and a second transfer unit for transferring an output signal from the third latch in response to a second latency enable signal; and
a detecting signal generation unit configured to receive a signal obtained for buffering the write recognition signal and the signals transferred from the first and second transfer units, and perform a logical operation to the received signals, thereby generating the detecting signal,
wherein the first latency enable signal is enabled in response to the second or third latency signal, and the second latency enable signal is enabled in response to the third latency signal.

18. The counter control signal generating circuit according to claim 17, wherein the first transfer unit comprises:
a first logic device configured to receive the output signal from the first latch, a signal obtained after buffering the output signal from the second latch, and the first latency enable signal, and perform a first logical operation to the received signals; and
a second logic device configured to receive the output signal from the first logic device and the first latency enable signal, and perform a second logical operation to the output signal of the first logic device and the first latency enable signal.

19. The counter control signal generating circuit according to claim 17, wherein the second transfer unit comprises:
a first logic device configured to receive the output signal from the third latch, a signal obtained after buffering the output signal from the fourth latch, and the second latency enable signal, and perform a first logical operation to the received signals; and
a second logic device configured to receive the output signal from the first logic device and the second latency enable signal, and perform a second logical operation to the output signal of the first logic device and the second latency enable signal.

20. The counter control signal generating circuit according to claim 17, further comprising:
an enable signal generator configured to receive the first and second latency signals, and generate the first and second latency enable signals,
wherein the enable signal generator comprises:
a delay device for delaying the first latency signal for a predetermined period;
a first buffer for buffering an output signal from the delay device, thereby generating the first latency enable signal;
a logic unit configured to receive the output signal from the delay device and the second latency signal, and perform a logical operation to the received signals; and
a second buffer for buffering an output signal from the logic unit, thereby generating the second latency enable signal.

* * * * *